(12) United States Patent
Sharma et al.

(10) Patent No.: US 8,462,572 B2
(45) Date of Patent: Jun. 11, 2013

(54) VARIABILITY RESILIENT SENSE AMPLIFIER WITH REDUCED ENERGY CONSUMPTION

(75) Inventors: Vibhu Sharma, Leuven (BE); Stefan Cosemans, Lier (BE); Wim Dehaene, Kessel-Lo (BE); Francky Catthoor, Temse (BE); Maryam Ashouei, Eindhoven (NE); Jos Huisken, Waalre (NE)

(73) Assignees: Stichting IMEC Nederland, Eindhoven (NL); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 13/231,706

(22) Filed: Sep. 13, 2011

(65) Prior Publication Data

US 2012/0063252 A1    Mar. 15, 2012

Related U.S. Application Data

(60) Provisional application No. 61/382,243, filed on Sep. 13, 2010.

(51) Int. Cl.
| | | |
|---|---|---|
| *G11C 7/02* | (2006.01) | |
| *G11C 7/00* | (2006.01) | |
| *H03F 3/45* | (2006.01) | |

(52) U.S. Cl.
USPC ............. 365/208; 365/205; 365/207; 327/51; 327/52; 327/57

(58) Field of Classification Search
USPC ....................................................... 365/208
See application file for complete search history.

(56) References Cited

U.S. PATENT DOCUMENTS

| | | | | |
|---|---|---|---|---|
| 4,555,777 | A | * | 11/1985 | Poteet ........................... 365/205 |
| 5,023,841 | A | * | 6/1991 | Akrout et al. .................. 365/205 |
| 5,126,974 | A | * | 6/1992 | Sasaki et al. ................... 365/207 |
| 5,245,223 | A | * | 9/1993 | Lim et al. ......................... 327/80 |
| 6,104,655 | A | | 8/2000 | Tanoi et al. |
| 6,326,815 | B1 | * | 12/2001 | Sim et al. ......................... 327/57 |
| 6,404,686 | B1 | * | 6/2002 | Aipperspach et al. ........ 365/205 |
| 6,424,577 | B2 | * | 7/2002 | Sim .......................... 365/189.05 |
| 6,556,471 | B2 | | 4/2003 | Chappell et al. |
| 6,617,885 | B2 | * | 9/2003 | Lim et al. ......................... 327/57 |
| 6,707,321 | B2 | * | 3/2004 | Cho et al. ......................... 327/51 |
| 6,788,112 | B1 | * | 9/2004 | Chan et al. ....................... 327/51 |
| 6,847,569 | B2 | * | 1/2005 | Sinha et al. .................... 365/207 |

(Continued)

OTHER PUBLICATIONS

N. Verma, & A.Chandrakasan, "A 256kb 65nm 8T Sub threshold SRAM employing Sense-Amplifier Redundancy," IEEE J.Solid-State Circuits pp. 141-149, Jan. 2008.

(Continued)

*Primary Examiner* — Son Mai
(74) *Attorney, Agent, or Firm* — Knobbe Martens Olson & Bear LLP (57) ABSTRACT

An ultra low power sense amplifier circuit for amplifying a low swing input signal to a full swing output signal is disclosed. In one aspect, the amplifier circuit includes a first amplifier stage for pre-amplifying the input signal to an intermediate signal on its internal nodes, a second amplifier stage for amplifying the intermediate signal to the output signal, and a control circuit for sequentially activating the first and second amplifier. The first amplifier has a capacitor for limiting energy consumption and two upsized PMOS transistors without NMOS transistors.

18 Claims, 10 Drawing Sheets

U.S. PATENT DOCUMENTS

| | | | | |
|---|---|---|---|---|
| 7,313,040 B2 * | 12/2007 | Huang et al. | | 365/205 |
| 7,512,908 B2 | 3/2009 | Hanafi et al. | | |
| 7,573,756 B2 * | 8/2009 | Seo | | 365/189.15 |
| 7,800,970 B2 * | 9/2010 | Hong et al. | | 365/208 |
| 8,031,547 B2 * | 10/2011 | Fort et al. | | 365/208 |
| 2008/0048728 A1 * | 2/2008 | Hong et al. | | 327/51 |

OTHER PUBLICATIONS

S.Cosemans, W.Dehaene, F.Catthoor, "A 3.6pJ/Access 480MHz, 128kbit On-Chip SRAM with 850MHz Boost Mode in 90nm CMOS with Tunable Sense Amplifiers," IEEE J.Solid State Circuits, pp. 2065-2077, Jul. 2009.

V.Sharma et al., "A 4.4pJ/Access 80MHz, 2K Word X 64b Memory with Write Masking Feature and Variability Resilient Multi-Sized Sense Amplifier Redundancy for W.S.Nodes", Proc. IEEE ESSCIRC, pp. 358-361, 2010.

Sinangil, M., E., N. Verma, A.Chandrakasan, "A 45nm 0.5V 8T Column-Interleaved SRAM with on-Chip Reference Selection Loop for Sense-Amplifier," Proc. IEEE Asian Solid-State Circuits Conference (A-SSCC), pp. 225-228, Nov. 2009.

A.Kawasumi et al., "A Low-Supply-Voltage-Operation SRAM With HCI Trimmed Sense Amplifiers" IEEE J.Solid State Circuits, pp. 2341-2347, Nov. 2010.

M.Bhargava, M.P.McCartney, A.Hoefler, & K.Mai, "Low-Overhead, Digital Offset Compensated, SRAM Sense Amplifiers" Proc. IEEE Custom Integrated Circuits Conference (CICC), pp. 24-2-1-24-2-4, Sep. 2009.

Shibata et al., "A 0.5V 25MHz 1-mW 256Kb MTCMOS/SOI SRAM for Solar-Power-Operated Portable Personal Digital Equipment—Sure Write Operation by Using Step-Down Negatively Overhead Bitline Scheme", IEEE J.Solid-State Circuits pp. 728-742, Mar. 2006.

M. Yabuuchi et al., "A 45mn 0.6V Cross-Point 8T SRAM with Negative Biased Read/Write Assist". 2009 Symposium on VLSI Circuits Digest of Technical Papers.

Peter Geens Ph.D. Thesis, "Active Supply Control in Static Random Access Memories", p. 24, Apr. 2009.

The extended European search report for European Patent Application No. 11181087.5 dated Nov. 9, 2012 by European Patent Office.

* cited by examiner

VARIABILITY RESILIENT SENSE AMPLIFIER WITH REDUCED ENERGY CONSUMPTION

CROSS REFERENCE TO RELATED APPLICATIONS

This application claims priority under 35 U.S.C. §119(e) to U.S. provisional patent application 61/382,243 filed on Sep. 13, 2010, which application is hereby incorporated by reference in its entirety.

BACKGROUND OF THE INVENTION

1. Field of the Invention

The disclosed technology relates to a sense amplifier for amplifying a low swing voltage signal, and further relates to an electronic memory such as SRAM, DRAM, FLASH comprising such a sense amplifier.

2. Description of the Related Technology

Sense amplifiers (SAs) are used widely in digital circuits for a number of applications including SRAM, DRAM. The purpose of a sense amplifier is to detect a small input signal such as e.g. a small voltage difference between two bitlines of a static random access memory (SRAM), and to amplify the difference signal to a full swing voltage (e.g. VSS or VDD). One of the most important metrics for a sense amp is the input referred offset. The differential input voltage must exceed this input referred offset in order to cause the sense amplifier to amplify the input signal to the correct large swing value at its output.

Continued process scaling tends to cause increases in the input referred offset of sense amplifier topologies. This is largely due to the overall increase in process variation due to mechanisms such as lithographic variation and random doping fluctuation (RDF). These local variations cause the threshold voltage (Vt) of transistors with identical layout to be distributed normally, and the standard deviation of the Vt distribution is proportional to $1/\sqrt{(WL)}$ (Pelgrom's law). Differences in the threshold voltage will lead to increased input referred offset for the SA.

One possible solution for building a reliable sense amplifier (SA) as technology scales, is the upsizing of the transistor sizes of the sense amplifier, but this is a very energy expensive solution. Sense amplifier calibration is a family of techniques that aims to solve the sense amplifier mismatch offset problem enabling a low input swing sensing without increasing the energy consumption and the sensing delay. Calibration techniques as described in [1]-[6] are quite effective, but for many applications, the introduction of a separate calibration phase is not acceptable. Every test vector applied to calibrate the sense amplifier increases the test cost and test time. This inhibits the advantages offered by the calibration techniques and is not an option for low energy system on chip (SoC) designs.

SUMMARY OF CERTAIN INVENTIVE ASPECTS

Certain inventive aspects relate to a variability resilient sense amplifier circuit with a reduced energy consumption.

The sense amplifier circuit according to one inventive aspect is provided for amplifying an input signal to a differential output signal. It comprises a pre-amplifier stage having first components for pre-amplifying the input signal by a predefined factor during a first period, thereby generating an intermediate signal, the first components being sized for a predefined yield requirement with respect to a predefined minimum input swing. The amplifier circuit further comprises a sense amplifier connected to an output of the preamplifier, and having second components for amplifying the intermediate signal during a second period following the first period, thereby generating the differential output signal, the second components being sized for the same yield requirement with respect to the predefined factor times the predefined minimum input swing.

By partitioning the sense amplifier circuit in two stages, the total amplification can be divided in two partial amplifications, whereby the first stage gets the actual (low swing) input signal as input for generating the intermediate (moderate swing) signal, while the second stage gets the intermediate (moderate swing) signal as its input signal for generating the (large swing) output signal. This allows for optimizations not possible with a single stage sense amplifier.

By sizing the components of each stage to a predefined yield requirement (e.g. six sigma) with respect to their inputs, variability resilience can be achieved.

By activating the pre-amplifier during a predefined first period t1, which may e.g. be a pulsed activation signal, the voltage swing of the intermediate signal is limited. The energy consumption of the preamplifier is limited because of the reduced swing of the intermediate voltage. The energy consumption is inversely proportional to the square of the input voltage swing. As the input of the second stage is pre-amplified by the factor A, the area (size) and capacitance and energy of the second stage may be reduced by a factor proportional to the square of A. In this way the total energy consumption of the dual stage sense amplifier may be smaller than that of a single stage sense amplifier circuit designed for the same yield and input signal.

The sense amplifier circuit may further comprise a control circuit for activating the preamplifier during the first period and for activating the sense amplifier during the second period following the first period.

The control circuit may e.g. be a timing circuit for generating first control signals for activating the preamplifier stage during the first period, and for generating second control signals for activating the sense amplifier during the second period following the first period.

The timing circuit may be adapted for generating the second control signals such that the sense amplifier stage is activated substantially immediately after the deactivation of the preamplifier stage. With "substantially immediately after" is meant that the start of the second period substantially coincides with the end of the first period. In practice a timing difference less than about 1.0 ns, particularly less than about 0.5 ns may be chosen.

In this way the access time is decreased, without increasing the energy consumption.

The pre-amplifier may comprises a pair of cross coupled transistors for amplifying the input signal; a capacitor for storing a predetermined amount of charge, and having a capacitor node; a first switch connected between the capacitor node and a voltage supply for precharging the capacitor up to the predetermined amount of charge; a second switch connected between the capacitor node and the pair of cross coupled transistors for supplying the predetermined amount of charge on the capacitor to the pre-amplifier during the first period, the predetermined amount of charge on the capacitor limits the energy consumption of the pre-amplifier.

The impact of variations on the output swing of the intermediate signal is limited by using a limited charge stored on a capacitor for powering the pre-amplifier stage, instead of powering them from the power rail. This further reduces the excessive energy consumption of the sense amplifier circuit due to the process variations.

In an embodiment the cross-coupled transistors are two PMOS-transistors.

As the second stage takes a differential signal at its input signal, the absolute voltage level of the intermediate nodes (between the first and the second stage of the sense amplifier circuit) is not important, and NMOS cross coupled transistors may be omitted from the pre-amplifier stage, thereby reducing area and energy consumption.

In an embodiment the cross-coupled transistors are two NMOS-transistors.

Similarly as for the pre amplifier circuit consisting of PMOS cross coupled transistors, also for the pre amplifier circuit consisting of NMOS cross coupled transistors, it is the differential intermediate voltage which is input for the second stage rather than the absolute voltage level, so that in this case PMOS cross coupled transistors may be omitted from the pre-amplifier stage, thereby reducing area and energy consumption.

One inventive aspect relates to a memory comprising the sense amplifier circuit described above, in particular an SRAM, DRAM or FLASH device.

One inventive aspect relates to an electronic device comprising such a memory.

BRIEF DESCRIPTION OF THE DRAWINGS

The disclosure is further elucidated in the appending figures and figure description explaining preferred embodiments of the disclosure. Note that the figures are not necessarily drawn to the scale. The figures are intended to describe the principles of the disclosure. Further embodiments of the disclosure can use combinations of the different features and elements of the different drawings.

DETAILED DESCRIPTION OF CERTAIN ILLUSTRATIVE EMBODIMENTS

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present disclosure, the only relevant components of the device are A and B.

In this application, the terms "first amplifier stage", "pre-amplifier", "first sense amplifier", "first SA" and "BIG_SA" are used as synonyms.

In this application, the terms "second amplifier stage", "second sense amplifier", "second SA" and "SMALL_SA" are used as synonyms.

Sense amplifiers SA's are typically used in memory devices such as e.g. SRAM, DRAM or FLASH, for sensing "low swing" voltage signals and amplifying them to full swing signals. The use of low swing voltages (i.e. voltages with a reduced amplitude such as e.g. 100 mV in a device powered at 1.0 V) on the bitlines of such memory devices is a well known technique for increasing speed and saving energy.

Below, certain embodiments of sense amplifiers will be explained in combination with SRAM memory, but the disclosure is not limited thereto, and the person skilled in the art can readily apply the sense amplifier circuit in other memory devices. Before describing the sense amplifier, a brief description will be given about the working of 6T and 8T SRAM cells.

Figure 1:
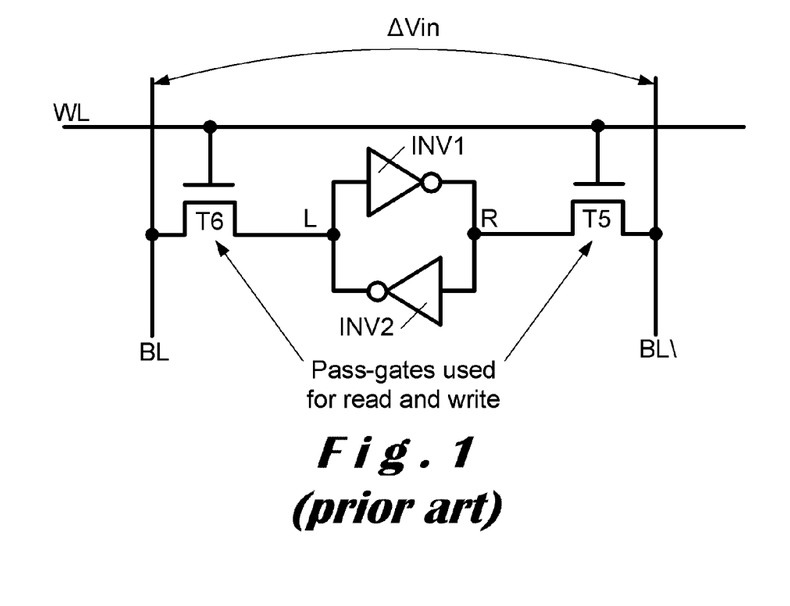
FIG. 1 shows a block diagram of a traditional 6T SRAM cell, with a pair of complementary bitlines.

FIG. 1 shows a block diagram of a traditional 6T SRAM cell. As its working is well known in the art, only a brief description will suffice for understanding the embodiment. Each SRAM cell includes a pair of inverters INV1, INV2 that operate together in a loop to store true and complement data. The local true bitline BL and the local complement bitline BL\ are connected to each SRAM cell by a pair of access transistors T5, T6 to respective true and complement sides of the inverters. A word-line WL provides the gate input to the access transistors T5, T6 for reading the value stored in the SRAM cell, or for writing a new value in the SRAM cell. Before a read operation occurs, both bitlines BL, BL\ are pre-charged to the supply voltage VDD. A read operation occurs when the word-line WL is activated. Since true and complement data is stored in the SRAM memory cell, either the pre-charged high true local bitline BL will be discharged if a "zero" was stored on the true side, or the pre-charged high complement bitline BL\ will be discharged if a "zero" was stored on the complement side. The local bitline BL or BL\ connected to the "one" side will remain in its high pre-charged state. The bitlines BL, BL\ are typically shared amongst a plurality of SRAM cells, and long lines typically have large capacities. It costs a lot of time and energy to completely charge/discharge the pair of bitlines to the supply/ground voltage VDD/VSS in order to determine the value stored in the SRAM cell. However, by making use of a sense amplifier SA, it is not required to completely charge/discharge the high-capacity bitlines. Instead, only a small voltage difference (i.e. a small differential signal) between the bitlines BL, BL\ suffices for determining the value stored. This is faster and requires less energy.

Figure 2:
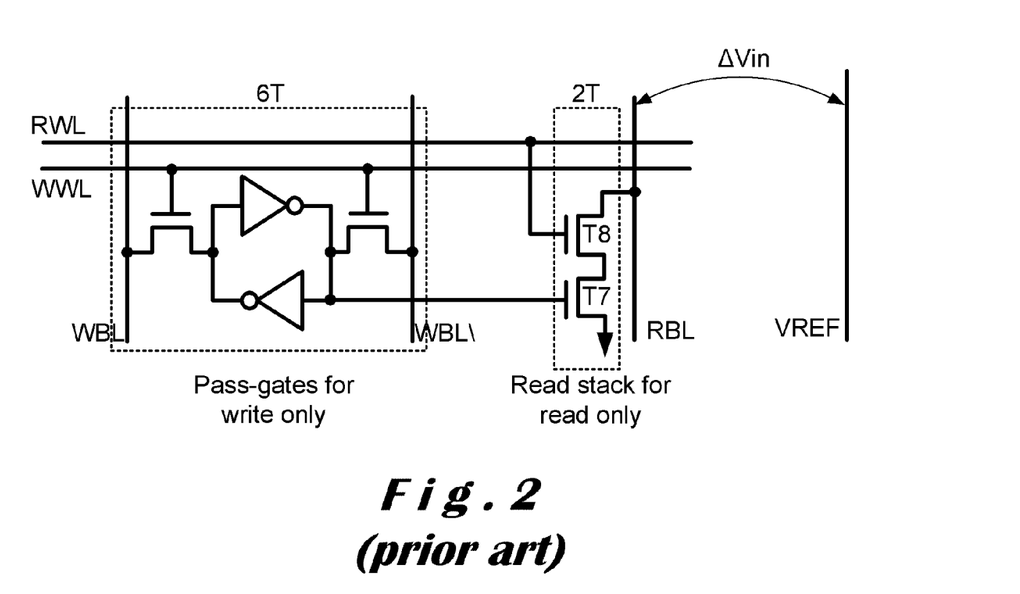
FIG. 2 shows a block diagram of a traditional 8T SRAM cell, with a pair of complementary write_bitlines and a single read_bitline.

FIG. 2 shows a block diagram of a traditional 8T SRAM cell, with a pair of complementary write_bitlines WBL, WBL\ and a single read_bitline RBL. Comparison with the 6T SRAM cell of FIG. 1 shows that a read port comprising two additional transistors T7, T8 and a read-bitline RBL and a read_word-line RWL are added to the 6T SRAM cell. Note that the read_and write_word-lines RWL, WWL, and the read- and write-bitlines WBL, WBL\, RBL are completely separate from each other. A read operation of an 8T SRAM cell is quite similar to that of an 6T SRAM cell, except that there is only one bitline RBL which will be pre-charged to the supply voltage VDD before actually reading. Then the read_word-line RWL is activated for enabling one of the transistors T8 of the read-port, so that the read_bitline RBL will be discharged if and only if the other transistor T7 of the read-port is enabled, depending on the value stored in the SRAM cell. A full discharge of the read_bitline RBL is not desired, and monitoring a small voltage drop on the read_bitline RBL suffices for determining the value stored in the SRAM cell. For single ended sensing (there is only one bitline RBL), a reference voltage VREF is used as a second input to the sense amplifier circuit, instead of the complementary bitline RBL\. Again, this is faster and requires less energy.

Figure 3:
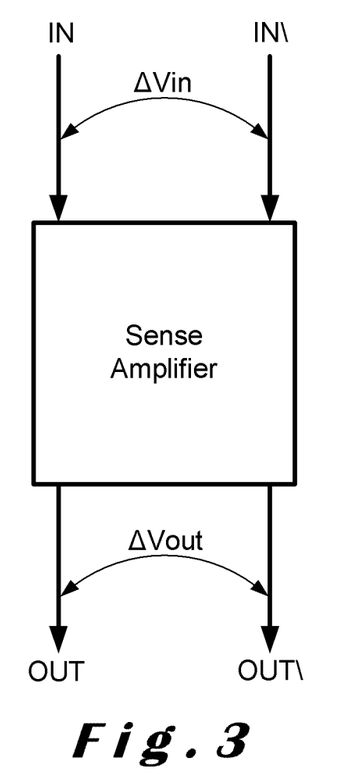
FIG. 3 shows an abstract block diagram of a sense amplifier.

FIG. 3 shows an abstract block diagram of a sense amplifier SA, getting a small difference signal ΔVin as input signal (e.g. 50 mV) and having to generate a full swing output signal ΔVout2. In the rest of this document a differential output signal is used to explain the embodiment, but the disclosure is not limited thereto.

It is known that intra die variations may impact the performance of sense amplifier circuits, and are the main source of the SA offset voltage, which puts a lower bound on the input signal ΔVin. In other words, the ability of a sense amplifier SA to sense a small bitline swing is limited by the distribution of its offset voltage. At the same time the bitline discharge is preferably minimized not only to maintain the performance but also to reduce the energy consumption associated with the charging and discharging of highly capacitive bitlines. A known solution for enabling low swing voltage sensing would be to use upsized sense amplifier critical transistors in order to reduce the mismatch offsets, but this would increase the sense amplifier energy consumption. This is problematic, in particular for the advanced technology nodes (65 nm LP CMOS and beyond) where the contribution of the sense amplifier energy to the total READ energy is becoming more prominent [2]. Hence, there is a need for reliable, low input swing sense amplifier circuit without increasing its energy consumption.

Process variations cause the threshold voltage Vt of transistors to be distributed normally, with a value having a mean μ, and a standard deviation a proportional to 1/√(WL) (Pelgrom's law). Differences in the threshold voltage Vt of the transistors of the sense amplifier SA may lead to increased offset voltage at the input of the sense amplifier SA. In order to achieve variation resilience (i.e. high yield, low failure rate), the sense amplifiers described herein are designed for a predefined yield, preferably a six sigma variation w.r.t. a minimum voltage difference ΔVmin<100 mV, for example 50 mV, without choosing the classical approach of merely upsizing the transistors, which would result in an excessive energy consumption increase and performance decrease.

Figure 4:
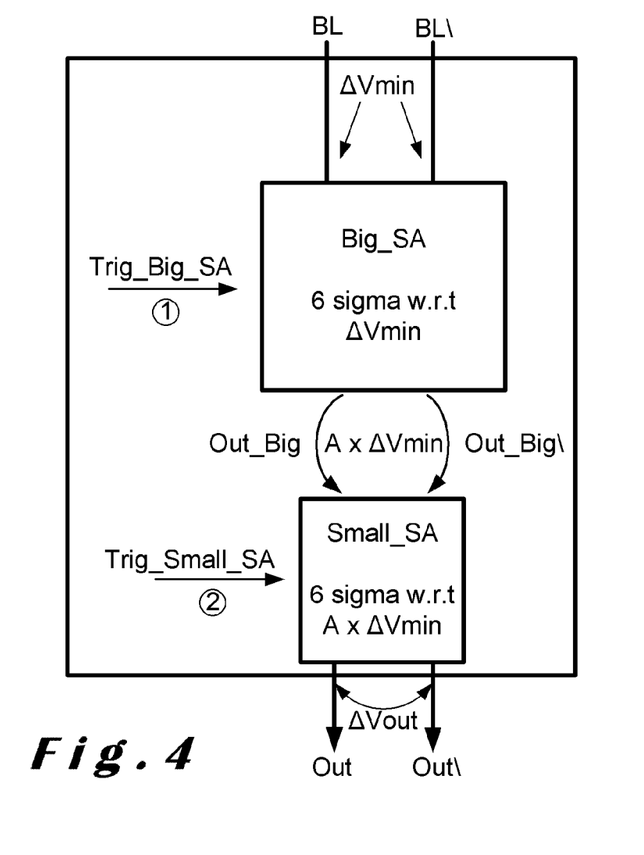
FIG. 4 shows a high-level block-diagram of the sense amplifier circuit according to one embodiment, comprising a first amplifier stage (Big_SA), followed by a second amplifier stage (Small_SA).
Figure 5:
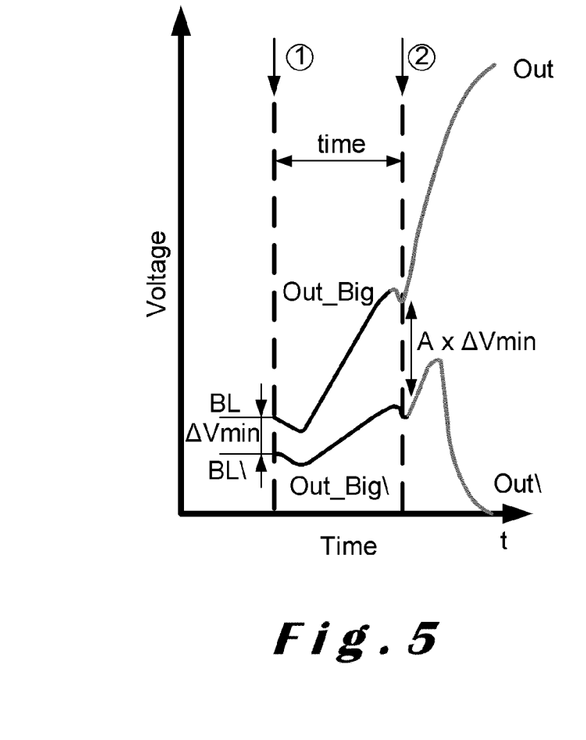
FIG. 5 shows a timing waveform illustrating the voltage swing of the input node and the output node of the first and second amplifier stages.
Figure 6:
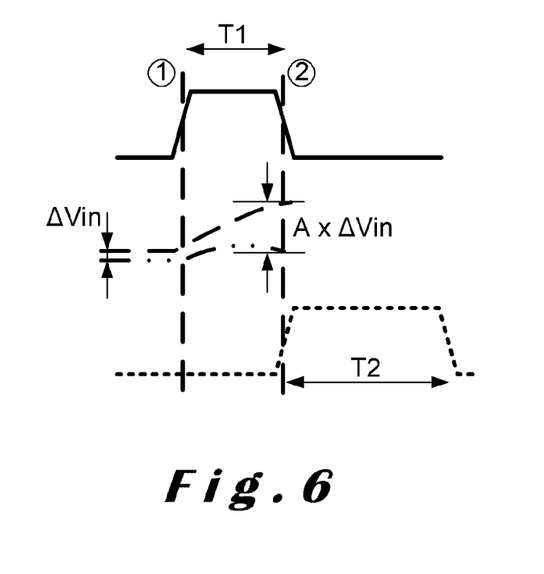
FIG. 6 illustrates the sequential activation of the first and second stage of the sense amplifier.
Figure 8:
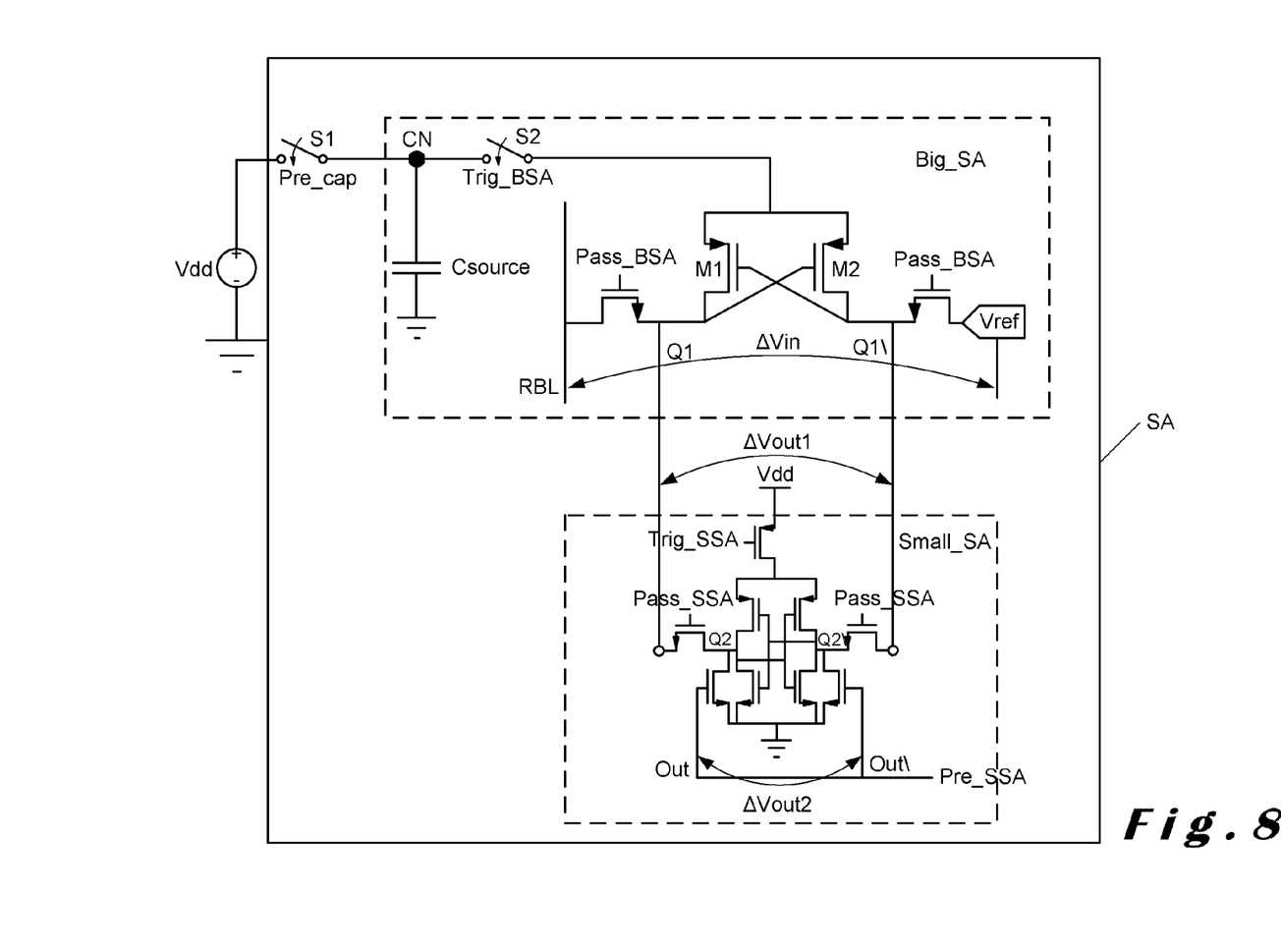
FIG. 8 shows a detailed circuit diagram of the sense amplifier circuit in one embodiment.

FIG. 4 shows a high-level block-diagram of the sense amplifier design according to certain embodiments of the present disclosure. FIG. 8 shows a detailed circuit diagram. This sense amplifier structure is further called "charge limited sequential sense amplifier", abbreviated CLS-SA. It comprises a first part Big_SA, followed by a second part Small_SA. Charge limited sequential sensing involves two sequentially activated sense amplifiers. The first big, sensitive SA senses a very small input signal ΔVin (e.g. in the order of 50 mV) by using upsized critical transistors M1, M2 which reduces the mismatch offset. The energy consumption due to the large capacitances on the internal nodes Q1, Q1\ of first SA is reduced by limiting the output swing of the intermediate signal Δvout1. The first SA acts as a pre-amplifier with a limited output swing. This limited output swing of the first SA is then resolved sequentially to a full voltage swing by a much smaller second SA (i.e. the size of its transistors are much smaller). As this second SA is small, it has low energy consumption. The pre amplification information of the first SA is available on its low capacity internal nodes Q1, Q1\, not on the high capacity bitlines. The input of the second SA is directly connected to the output of the first SA.

Before describing the circuit of FIG. 4 in detail, a few formulas will be presented for a dual stage sense amplifier.

The size of a sense amplifier SA is defined as:

$$S_{SA} = \left[\frac{n_{Fr} \times \sigma Vt}{\Delta Vmin}\right]^2 \quad (1)$$

wherein:
nFr: the target yield expressed in the number of standard deviations,
σVt: the standard deviation of the difference in threshold voltage between its input transistors,
ΔVmin: input bitline voltage swing.

The size of the first SA (Big_SA) is:

$$S_{first_{SA}} = \left[\frac{n_{Fr} \times \sigma Vt}{\Delta Vin, first}\right]^2 \quad (2)$$

wherein:

ΔVin,first: the input voltage swing for the first sense amplifier

The limited output swing of the first sense amplifier is $$\Delta V_{out,first} = A \times \Delta V_{in,first} \quad (3)$$

The input swing ΔVin,second for the second sense amplifier is the output swing of the first sense amplifier, available at its output nodes Q1, Q1\ (isolated from the bitlines RBL).

$$\Delta V_{in,second} = \Delta V_{out,first} \quad (4)$$

The size of the second SA (Small_SA) is:

$$S_{second_{SA}} \geq \left(\frac{n_{Fr} \times \sigma Vt}{\Delta V_{in,second}}\right)^2 \quad (5a)$$

$$S_{second_{SA}} = \left[\frac{n_{Fr} \times \sigma Vt}{A \times \Delta V_{in,first}}\right]^2 \quad (5)$$

The first and second SA are designed for the same target yield (nFr=6 σ). However, the second SA is designed with respect to the larger input swing of A×ΔVin. Therefore, the size and capacitances of the internal nodes Q2, Q2\ of the second SA is $A^2$ times smaller than those of the first SA.

$$S_{second_{SA}} = \frac{S_{first_{SA}}}{A^2} \quad (6)$$

From these formulas it can be seen that the area of the second SA can be much smaller (factor $A^2$) than the area of the first SA. As capacitance is proportional to the SA transistor area, the transistors of the second SA are preferably much smaller than the transistors of the first SA.

The total energy consumption associated with the charge limited sequential sensing is:

$$E_{Total,CLS-SA} = E_{first_{SA}} + E_{second_{SA}} \quad (7a)$$

$$E_{first_{SA}} = C_{first_{SA}} \times Vdd \times A \times \Delta V_{in} \quad (7b)$$

$$E_{second_{SA}} = C_{second_{SA}} \times Vdd \times Vdd \quad (7c)$$

$$E_{Total,CLS-SA} \cong Vdd \times C_{first_{SA}} \times \left(A \times \Delta V_{in} + \frac{1}{A^2} \times Vdd\right) \quad (7)$$

From these formulas it can be seen that the total energy consumption of a dual stage sense amplifier may be substantially smaller than that of a single stage amplifier.

The overall failure rate of CLS-SA is:

$$Prb_{CLS-SA}[\text{fail}] \approx fr_{first_{SA}} + fr_{second_{SA}} \quad (8)$$

wherein:

$fr_{first\_SA}$: failure rate of the first SA
$fr_{second\_SA}$: failure rate of the second SA In order to achieve variability resilience, both the first_SA and the second_SA will be designed for the predefined yield, e.g. six sigma.

Illustrative Circuit Implementation

An example of the sense amplifier design based on the concept of charge limited sequential sensing is shown in FIG. 8. In this embodiment the first SA Big_SA consists of only a PMOS cross coupled pair M1, M2 rather than the entire structure of the voltage latch type sense amplifier. Note that the input signal ΔVin in this example is formed by the voltage difference of the read_bitline RBL and a reference voltage Vref. In other embodiments the input signal may e.g. be formed by a differential signal between a true and complement bitline RBL, RBL\. The voltage difference between the two output nodes Q1, Q1\ of the Big_SA defines the offset requirements for the second SA Small_SA, not the absolute potential on the output nodes Q1, Q1\. As it is not necessary to pull one output node up and the complementary output node towards ground, the NMOS transistors can be omitted, so that the design of the Big_SA is free of NMOS Vt mismatches and the energy and area consumption is reduced. The Vt mismatch of the PMOS transistors is reduced by upscaling the transistor sizes, as will be described further.

In another embodiment (not shown), the preamplifier stage has two NMOS transistors, and the PMOS transistors can be omitted, so that the design is free of PMOS Vt mismatches, and the energy and area consumption is reduced.

Figure 7:
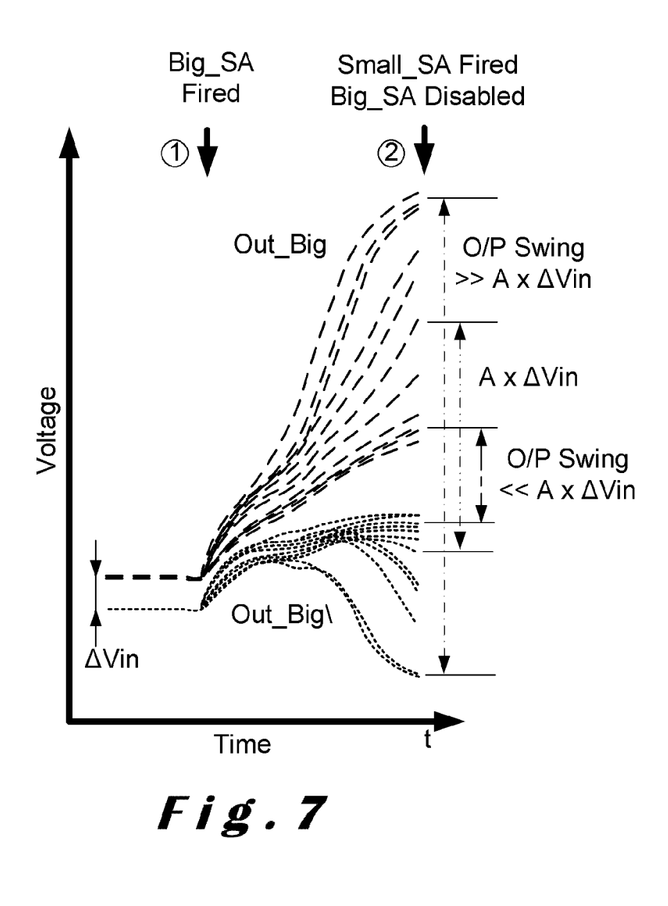
FIG. 7 shows the impact of intra/inter die variations on the voltages at the output of the first amplifier stage.

Both intra and inter die process variations may result in a huge spread of the output swing of the Big_SA, as shown in FIG. 7. For correct functionality, the first SA is activated during a sufficiently long time period t1 to ensure that its resulting output swing is sufficiently large. The time required to generate its output signal Out_Big, Out_Big\ depends mainly on the threshold voltage Vt of the critical PMOS transistors M1, M2. A minimal required time period t1 can be defined as the worst-case combination of process corner and transistor mismatch.

During this time period, the pre-amplifiers of all other SAs (of the other bitlines) may develop a much larger output voltage swing, which may impact the energy-efficiency of limited swing sequential sensing. In order to remedy this problem, a solution has been in replacing the power rail of the Big_SA with a pre-charged capacitor Cs, which is pre charged before the sensing operation starts. The value of the capacitor Cs can be chosen large enough that it can ensure sufficient voltage swing of the first output voltage ΔVout1 at the internal nodes for the slowest SAs, but it can limit the output swing for the fastest SAs.

An alternative solution could be to use a well controlled switch between the power rail and the BIG_SA, such that the BIG_SA is timely disconnected from the power rail.

Figure 9:
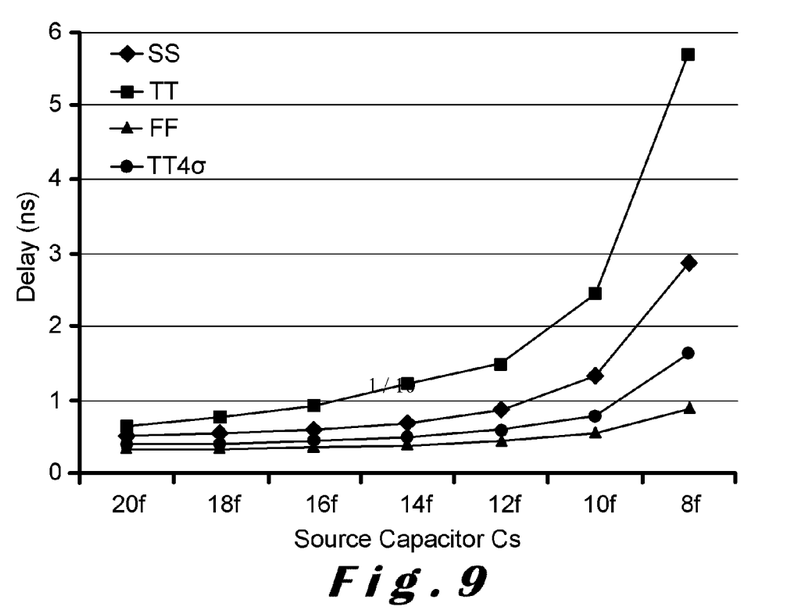
FIG. 9 shows the mean sensing delay of the first amplifier stage (Big_SA) for $\Delta Vin=50$ mV and amplification factor A=4, for different values of source capacitors Cs.
Figure 10:
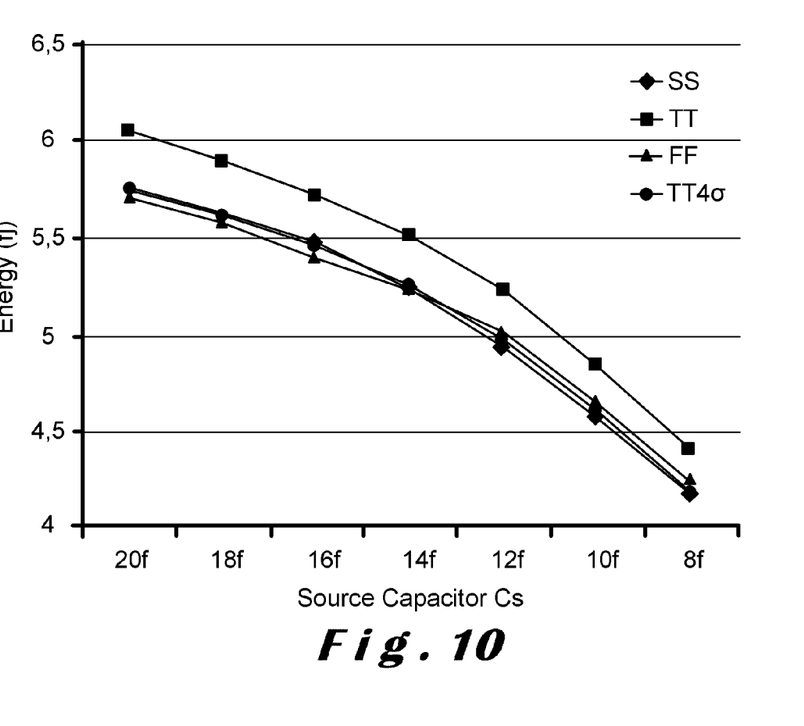
FIG. 10 shows a graph of the mean sensing energy consumption of the first amplifier stage (Big_SA) for $\Delta Vin=50$ mV, and amplification factor A=4.

FIG. 9 shows the latency between the activation of Big_SA and the time at which the first output swing ΔVout1 has reached the value 4×ΔVin. Increasing the value of the source capacitor Cs improves the sensing speed but at the same time increases the energy consumption associated with the recharging of the source capacitors Cs after the sensing operation (FIG. 10).

DETAILED ILLUSTRATIVE EXAMPLE

The sense amplifier circuit will be further illustrated for a wireless sensor node application having an SRAM memory of 90 MHz, and very stringent energy constraints, and a target yield of six sigma. Therefore the value of the source capacitor Cs is chosen less than 10 fF, corresponding to a worst case delay of approximately 2.5 ns (FIG. 9) which is acceptable in this application. The person skilled in the art may choose other values for the source capacitor to meet other timing constraints.

In the CLS-SA circuit of FIG. 8, the activation of the top transistors M1, M2 of the Big_SA not only initiates the sensing operation by the cross coupled PMOS pair but also starts the charge sharing mechanism between the source capacitor Cs and the load capacitance Cload (the capacitance of the Big_SA circuit). The final voltage Vf on the source capacitor Cs available after the charge sharing is $$Vf = \frac{Cs \times VDD}{(Cs + C_{load})} \quad (9)$$

Figure 11:
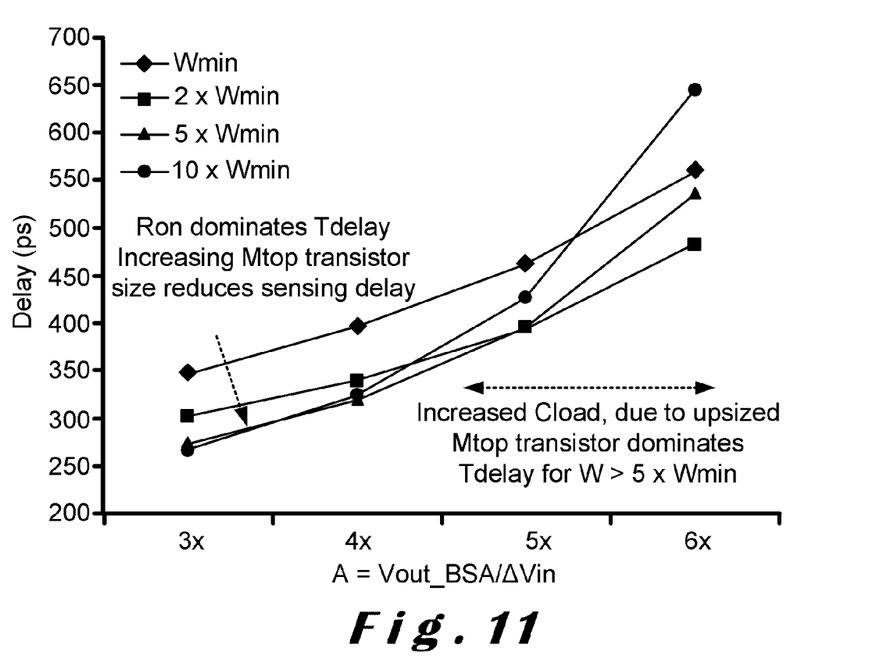
FIG. 11 shows the mean sensing delay for $\Delta Vin=50$ mV for source capacitor=20 fF for different amplification factors A.

Increasing the transistor size from 1×Wmin to 2×Wmin (wherein Wmin denotes the smallest transistor size in a given technology) reduces the on-resistance Ron and accelerates the sensing speed of the PMOS cross coupled pair, as shown in FIG. 11, which shows the mean sensing delay for ΔVin=50 mV for source capacitor Cs=20 fF for different amplification factors A. But increasing the top transistor size also increases their capacitance. As a result, the final voltage Vf decreases, and the sensing delay increases with increasing top transistor size. Increasing the top transistor size from 2×Wmin to 5×Wmin helps in reducing the sensing delay only for amplification factors A less than 4 (sensing delay dominated by Ron), but for amplification factors A larger than 4, the Vf value is reduced because of the increased load capacitance which increases the sensing delay (sensing delay dominated by Cload). The role of the load capacitance Cload in the determination of the sensing delay becomes more prominent compared to the reduced on-resistance Ron for the 10×Wmin sized top transistors M1, M2. In other words, further increasing the top transistor size does not help in reducing the sensing delay. Increasing the top transistor size also increases the energy consumption. Therefore, in the example, the size of the top transistors M1, M2 is kept minimum, i.e. only as large as indicated by the target yield but not larger, in order to reduce the energy consumption for the given target timing budget.

In the example the cross coupled PMOS pair of Big_SA is designed for nFr=6 σ, with respect to the input voltage difference ΔVin, chosen to be ΔVmin=50 mV. As described above, an input swing of less than 100 mV is desirable in order to save energy consumption associated with charging and discharging of high capacitive bitlines and in order to improve the access speed as the SRAM cell has to discharge less. Choosing ΔVin=50 mV means that the SRAM cell has to discharge the readbitline only by 50 mV before the sense amplifier can be triggered.

Figure 12:
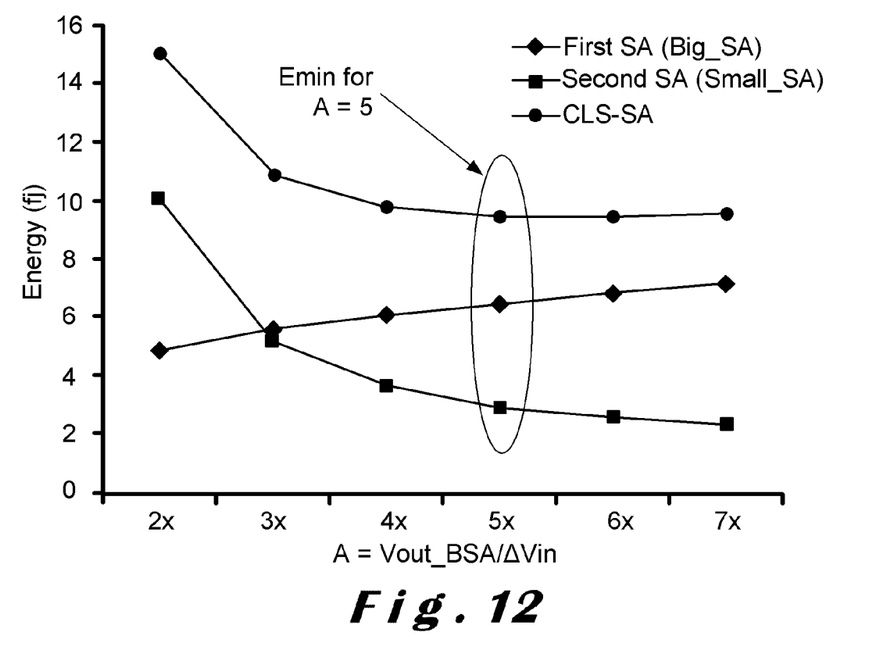
FIG. 12 shows the total energy consumption of the sense amplifier circuit in one embodiment for $\Delta Vin=50$ mV, showing a minimum at amplification factor A=5.

In the example the amplification factor A is chosen equal to 5 for energy optimum results, as shown in FIG. 12, illustrating the energy consumption for ΔVin=50 mV, but the value of A=4 or A=6 would also yield very good results.

Because failure of the Big_SA and Small_SA are equally important (formula 8), the critical transistors of the second amplifier Small_SA are designed for the same target yield nFr=6 σ, but with respect to a higher input swing of A×ΔVin. In this way the Small_SA is also variability resilient and the energy consumption of the first and the second amplifier Big_SA+Small_SA is optimized for minimal energy.

Circuit Operation:

The sense amplifier of FIG. 8 is operated as follows by a control circuit (not shown), which generates control signals having timing waveforms for operating the circuit as described next. First there is a pre-charge phase, wherein a pre-charge control signal Pre_cap closes a first switch S1 for pre-charging the source capacitor Cs of the CLS-SA. This pre-charge operation is preferably overlapped (in time) with the SRAM bitline RBL pre-charge operation, thereby avoiding pre-charge latency during the sensing operation of the CLS-SA, as well as additional timing complexity.

Figure 13:
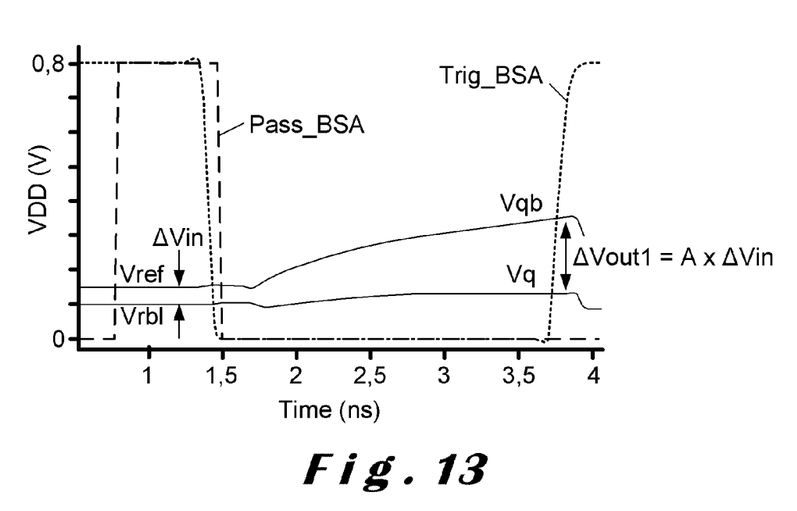
FIG. 13 shows a timing waveform for the first amplifier stage (Big_SA).

Subsequently there is a sensing phase, wherein the control signal Pass_BSA is enabled for transferring the low swing input signal Δvin, between the bitline RBL and the reference voltage VREF onto the internal nodes Q1, Q1\ of the first amplifier Big_SA Then the control signal Trig_BSA powers the cross coupled PMOS pair M1, M2 by connecting them to the charge reservoir Cs, and the control signal Pass_BSA is disabled again for isolating the internal nodes Q1, Q1\ of the first amplifier Big_SA from the bitline RBL and the reference voltage VREF. This is illustrated in FIG. 13 showing a timing waveform of the partial amplification done by the first amplifier stage Big_SA, which converts the input signal ΔVin to the intermediate signal ΔVout1, the latter being at least (i.e. worst case) equal to A×ΔVin.

Referring back to FIG. 8, after the first amplifier stage Big_SA has amplified the low swing input signal ΔVin to A×ΔVin, the control signal Trig_BSA is disabled for decoupling the source capacitor Cs from the first amplifier Big_SA. The amount of charge $\Delta Q_{BSA}$ consumed by the BIG_SA during the pre-amplification is restored back on the source capacitor Cs during the next pre-charge phase.

Figure 14:
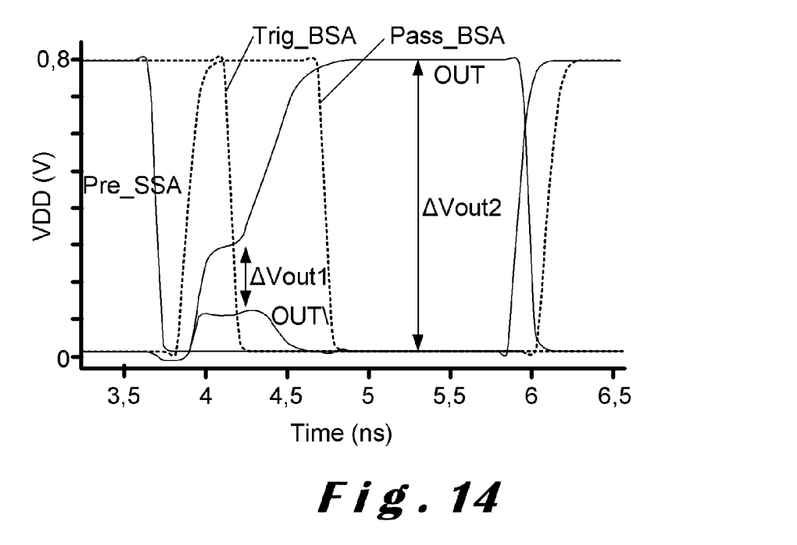
FIG. 14 shows a timing waveform for the second amplifier stage (Small_SA).

The pre-amplified signal ΔVout1 on the nodes Q1, Q1\ of Big_SA is then transferred to the second amplifier Small_SA. FIG. 14 shows a timing waveform for the second amplifier Small_SA, which converts the pre-amplified signal ΔVout1 into the full voltage swing signal ΔVout2. The pre-charge control signal Pre_SSA of the second amplifier Small_SA used for initializing the output nodes Out, Out\ to VSS for avoiding floating voltage output nodes, is disabled and the control signal Pass_SSA (FIG. 8) is enabled for transferring the output information ΔVout1 of the first amplifier Big_SA onto the internal nodes Q2, Q2\ of the second amplifier Small_SA. Then the second amplifier Small_SA is enabled by the control signal Trig_SSA for amplifying the signal ΔVout1 on the nodes Q2, Q2\ to a full swing voltage ΔVout2 on the nodes Out, Out\.

The sense amplifier CLS-SA achieves variability resilient low energy sensing operation. The first amplifier Big_SA ensures correct functionality by using upsized transistors for resolving the small input voltage difference ΔVin on the bitline RBL. The energy consumption associated with the upsized transistors M1, M2 is limited by having partial amplification. This partial amplified information is then later fully resolved by the second amplifier Small_SA. The second amplifier uses little energy because it is small (see formula 7c). The sizing requirements of the second amplifier Small_SA are much relaxed (formula 6) as compared to the first amplifier Big_SA because of the pre-amplification by the factor A. Therefore, the energy consumption is much reduced.

Figure 15:
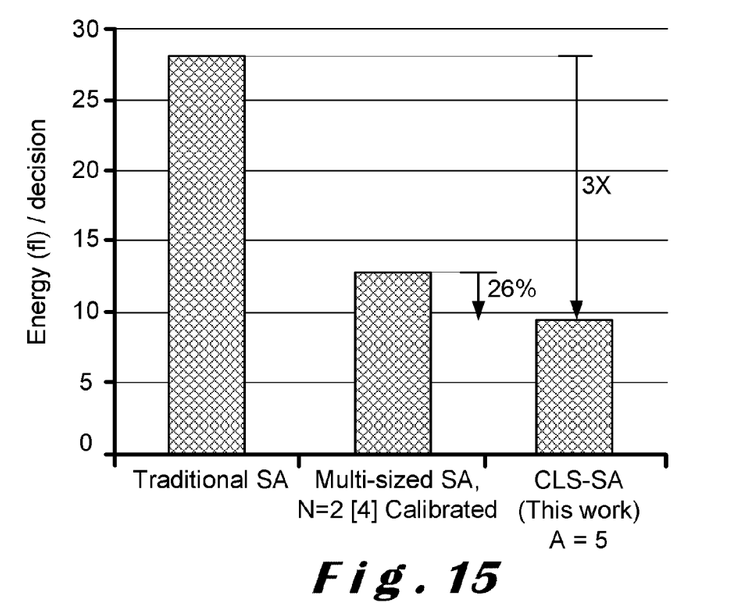
FIG. 15 shows a diagram comparing the energy consumption of the sense amplifier circuit in one embodiment with other sense amplifiers.

As illustrated in FIG. 15, simulations of the sense amplifier CLS-SA may achieve a 3× reduction in the energy consumption as compared to the traditional uncalibrated sense amplifier design for the same six sigma target yield. The performed circuit optimizations: better control of pre-amplification factor A by the introduction of a source capacitor Cs, the elimination of the NMOS cross coupled pair from the first amplifier Big_SA, and the optimal sizing of the top transistors M1, M2 further reduce the energy consumption. The sense amplifier CLS-SA is designed for ΔVmin (discharge of an asserted SRAM cell)<100 mV and worst-case process (six sigma), and therefore does not require any calibration phase as required by most of the post-silicon tuning techniques, which reduces the production time and testing cost. The energy reduction is 26% better as compared to the best published calibrated sense amplifier in the same 65 nm technology [3].

The area of sense amplifier CLS-SA is comparable to that of the traditional sense amplifier used for the small signal ΔVin sensing. The first amplifier Big_SA consists of only a PMOS cross coupled pair with the "minimum sized" (i.e. to achieve the target yield using Pelgrom's law, but not larger) top transistors. The transistor sizes for the second amplifier Small_SA is a factor $A^2$ smaller as compared to the first amplifier Big_SA (see formula 6). The source capacitor Cs is preferably implemented as a MOSFET gate capacitance, the Csource occupies only 1.14 $\mu m^2$ in 65 nm LP CMOS technology. The design also implements the extended bitline hierarchy, in which only 1 set of sense amplifiers are used, which further makes the area overhead of sense amplifiers of less relevance (as compared to the area occupied by the SRAM cells). The sense amplifier circuit CLS-SA consumes 11.36 fJ/decision and obtains an offset voltage σVoffset of 14.3 mV. The sense amplifier CLS-SA improves the trade-off between energy consumption and offset voltage.

Figure 16:
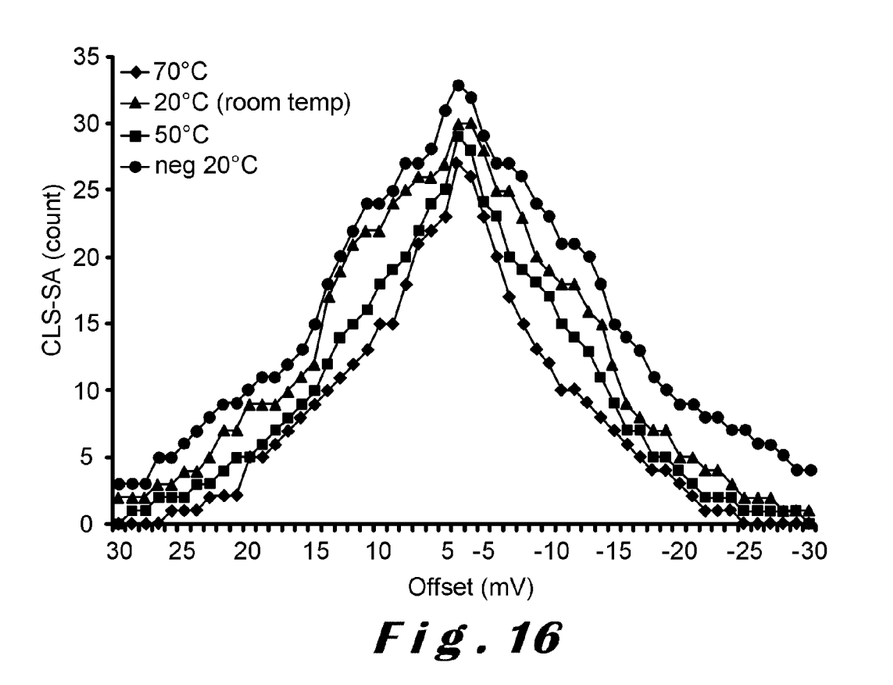
FIG. 16 shows a histogram of offset measurements of the sense amplifier circuit in one embodiment for different temperatures

FIG. 16 shows a histogram of a number of samples and their offset measurement at different temperatures (−20° C., +20° C., +50° C., +70° C.). As can be seen from this figure, the offset voltage decreases with increasing temperature. The reason for this is that the output swing of the pre-amplified signal ΔVout1 available to the second amplifier Small_SA increases at higher temperatures because of the reducing threshold voltage Vt.

Figure 17:
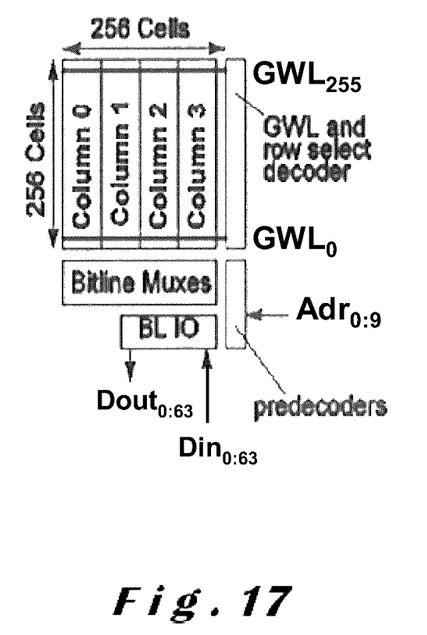
FIG. 17 shows a high-level block diagram of a 64 kbit SRAM memory device having the sense amplifier circuit in one embodiment.

FIG. 17 shows a high-level block diagram of an SRAM memory device having a plurality of sense amplifier circuits in one embodiment. This SRAM memory has 8T SRAM cells and is organized as a matrix of rows and columns. Each read_bitline RBL0-RBL63 is coupled to one sense amplifier circuit SA0-SA63. In an SRAM memory with 6T SRAM cells, there would be two complementary bitlines BL, BL\ connected to each sense amplifier. Despite of the variance on the threshold voltage of the transistors of the sense amplifiers due to process variations, the sense amplifiers in one embodiment will correctly resolve the low swing voltages on the bitlines, within the given timing constraints, and with a minimum energy consumption.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

Each of the following references is incorporated herein by references in its entirety.

REFERENCES

[1] N. Verma, & A. Chandrakasan, "A 256 kb 65 nm 8T Sub threshold SRAM employing Sense-Amplifier Redundancy," IEEE J. Solid-State Circuits pp. 141-149, January 2008.

[2] S. Cosemans, W. Dehaene, F. Catthoor, "A 3.6 pJ/Access 480 MHz, 128 kbit On-Chip SRAM with 850 MHz Boost Mode in 90 nm CMOS with Tunable Sense Amplifiers," IEEE J. Solid State Circuits, pp 2065-2077, July 2009.

[3] V. Sharma et al., "A 4.4 pJ/Access 80 MHz, 2K Word×64b Memory with Write Masking Feature and Variability Resilient Multi-Sized Sense Amplifier Redundancy for W. S. Nodes", Proc. IEEE ESSCIRC, pp 358-361, 2010.

[4] Sinangil, M., E., N. Verma, A. Chandrakasan, "A 45 nm 0.5V 8T Column-Interleaved SRAM with on-Chip Reference Selection Loop for Sense-Amplifier," Proc. IEEE Asian Solid-State Circuits Conference (A-SSCC), pp. 225-228, November 2009.

[5] A. Kawasumi et al., "A Low-Supply-Voltage-Operation SRAM With HCI Trimmed Sense Amplifiers" IEEE J. Solid State Circuits, pp 2341-2347, November 2010.

[6] M. Bhargava, M. P. McCartney, A. Hoefler, & K. Mai, "Low-Overhead, Digital Offset Compensated, SRAM Sense Amplifiers" Proc. IEEE Custom Integrated Circuits Conference (CICC), pp 24-2-1-24-2-4, September 2009.

What is claimed is:

1. A sense amplifier circuit for amplifying a differential voltage input signal to a differential output signal, the sense amplifier circuit comprises:
   a pre-amplifier comprising a first voltage sense amplifier, the first voltage sense amplifier being configured to pre-amplify the differential voltage input signal by a pre-defined factor during a first period, thereby generating an intermediate differential voltage signal, the first voltage sense amplifier being sized for a predefined yield requirement with respect to a predefined minimum input swing; and
   a second voltage sense amplifier connected to an output of the pre-amplifier, and the second voltage sense amplifier being configured to amplify the intermediate differential voltage signal during a second period following the first period, thereby generating the differential output signal, the second voltage sense amplifier being sized for the same yield requirement with respect to the predefined factor times the predefined minimum input swing.

2. The sense amplifier circuit according to claim 1, further comprising a control circuit configured to activate the pre-amplifier during the first period and further configured to activate the second voltage sense amplifier during the second period immediately following the first period.

3. The sense amplifier circuit according to claim 1, wherein the pre-amplifier comprises:
   a pair of cross coupled transistors configured to amplify the input signal;
   a capacitor configured to store a predetermined amount of charge, the capacitor comprising a capacitor node;
   a first switch connected between the capacitor node and a voltage supply and being configured to precharge the capacitor; and
   a second switch connected between the capacitor node and the pair of cross coupled transistors, the second switch being configured to activate the pre-amplifier during the first period, the predetermined amount of charge on the capacitor limiting the energy consumption of the pre-amplifier.

4. The sense amplifier circuit according to claim 3, wherein the cross coupled transistors are PMOS transistors.

5. The sense amplifier circuit according claim 3, wherein the cross coupled transistors are NMOS transistors.

6. The sense amplifier circuit according to claim 1, wherein the pre-amplifier comprises a capacitor configured to limit energy consumption of the pre-amplifier.

7. The sense amplifier circuit according to claim 1, wherein the pre-amplifier comprises two PMOS transistors and no NMOS transistors.

8. A memory comprising the sense amplifier circuit according to claim 1.

9. The memory according to claim 8, wherein the memory is selected from the group of SRAM, DRAM, and FLASH.

10. An electronic device comprising the memory of claim 8.

11. A sense amplifier circuit for amplifying a differential voltage input signal to a differential output signal, the sense amplifier circuit comprises:
   means for pre-amplifying the differential voltage input signal by a predefined factor during a first period, thereby generating an intermediate differential voltage signal, wherein the pre-amplifying means comprises a first voltage sense amplifier;
   means for amplifying the intermediate signal differential voltage during a second period following the first period, thereby generating the differential output signal; and
   means for sequentially activating the pre-amplifying means and the amplifying means.

12. The sense amplifier circuit according to claim 11, wherein the amplifying means comprises a second voltage sense amplifier.

13. The sense amplifier circuit according to claim 11, wherein the activating means comprises a control circuit.

14. The sense amplifier circuit according to claim 11, wherein the pre-amplifying means comprises a capacitor configured to limit energy consumption of the pre-amplifying means.

15. The sense amplifier circuit according to claim 11, wherein the pre-amplifying means comprises two PMOS transistors and no NMOS transistors.

16. The sense amplifier circuit according to claim 11, wherein the pre-amplifying means comprises:
   a pair of cross coupled transistors configured to amplify the input signal;
   a capacitor configured to store a predetermined amount of charge, the capacitor comprising a capacitor node;
   a first switch connected between the capacitor node and a voltage supply and being configured to precharge the capacitor; and
   a second switch connected between the capacitor node and the pair of cross coupled transistors, the second switch being configured to activate the pre-amplifier during the first period, the predetermined amount of charge on the capacitor limiting the energy consumption of the pre-amplifier.

17. The sense amplifier circuit according to claim 1, wherein the first voltage sense amplifier's operation is triggered by a control signal.

18. The sense amplifier circuit according to claim 2, wherein the control circuit is configured to deactivate the pre-amplifier during the second period.

* * * * *